United States Patent
Chadwick

(12) 
(10) Patent No.: US 6,341,079 B1
(45) Date of Patent: Jan. 22, 2002

(54) CONTENT ADDRESSABLE MEMORY DEVICE

(75) Inventor: Thomas B. Chadwick, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/863,848

(22) Filed: May 23, 2001

(51) Int. Cl.$^7$ .............................................. G11C 15/00
(52) U.S. Cl. ...................... 365/49; 365/189.07; 711/108
(58) Field of Search .............................. 365/49, 189.07, 365/149, 154; 711/108

(56) References Cited

U.S. PATENT DOCUMENTS

| | | | |
|---|---|---|---|
| 5,173,872 A | 12/1992 | Crawford et al. | 365/49 |
| 5,396,449 A | 3/1995 | Atallah et al. | 365/49 |
| 5,485,418 A | 1/1996 | Hiraki et al. | 365/49 |
| 5,740,097 A * | 4/1998 | Satoh | 365/49 |
| 5,852,569 A | 12/1998 | Srinivasan et al. | 365/49 |
| 5,859,791 A | 1/1999 | Schultz et al. | 365/49 |
| 5,978,246 A | 11/1999 | Shindo | 365/49 |
| 5,999,435 A | 12/1999 | Henderson et al. | 365/49 |
| 6,044,005 A | 3/2000 | Gibson et al. | 365/49 |
| 6,081,441 A | 6/2000 | Ikeda | 365/49 |
| 6,101,573 A | 8/2000 | Middleton et al. | 711/108 |
| 6,188,629 B1 * | 2/2001 | Kaplinsky | 365/49 |
| 6,195,278 B1 * | 2/2001 | Calin et al. | 365/49 |

* cited by examiner

Primary Examiner—Son Mai
(74) Attorney, Agent, or Firm—Schmeiser, Olsen & Watts; Daryl K. Neff

(57) ABSTRACT

A content addressable memory device comprises a NAND-NOR chain comprised an alternating sequence of NAND and NOR stages; the NAND stages, each including a first CAM cell comprising a first memory cell that stores a first data bit and a first compare cell that compares the first data bit with a first compare bit and generates a first compare signal indicating whether the first data bit matches the first compare bit and a logical NAND gate that combines the first compare signals of other first CAM cells in the NAND stage; the NOR stages, each including a second CAM cell comprising a second memory cell that stores a second data bit and a second compare cell that compares the second data bit with a second compare bit and generates a second compare signal indicating whether the second data bit matches the second compare bit and a logical NOR gate that combines the second compare signals of other second CAM cells in the NOR stage; and the NAND-NOR chain generating a match signal indicating a match of all the compare bits to all the data bits in the content addressable memory device.

22 Claims, 6 Drawing Sheets

CONTENT ADDRESSABLE MEMORY DEVICE

FIELD OF THE INVENTION

The present invention relates to the field of semiconductor memory; more specifically, it relates to content addressable memory (CAM), in which data is accessed and modified based upon the content of the stored data.

BACKGROUND OF THE INVENTION

A CAM device permits the contents of memory to be searched and matched without having to specify specific memory cell addresses in order to retrieve the data stored in the memory. To search a CAM device, every bit of each word in the memory is compared simultaneously with data placed in a compare register. If there is a match of every bit in a particular memory location with every bit of data in the compare register a match signal is asserted on a matchline. The match signals from every word are used to generate the address of the matching data in the CAM. CAM devices are useful because they have very fast search times compared to search times of normal random access memory (RAM) whether the RAM is a dynamic random access memory (DRAM) type or a static random access memory (SRAM) type.

Turning to FIG. 1, FIG. 1 is a block diagram of a related art CAM device. CAM device 100 comprises a plurality of CAM cells 105, each coupled to a wordline 110. An input of each CAM cell 105 is also coupled to a pair of bitlines 115 and a compare output of each CAM cell is coupled to the gate of an n-type field-effect transistor (NFET) 120. The drain of each NFET 120 is coupled to a matchline 125 and the source of each NFET 120 is coupled to ground. Matchline 125 is precharged high by a p-type field-effect transistor (PFET) 130 in response to a search enable signal (SE) applied to the gate of PMET 130. Data is written and read out of CAM cells 105 through bitline pairs 115. In a CAM array, which contains a plurality of CAM devices 100, a wordline signal applied to wordline 110 controls which CAM cells 105 data is written to or read from.

When CAM device 100 is idle, search enable is held low, causing matchline 125 to precharge high. In a search operation, search enable is brought high releasing the precharge. If the data bit stored in a particular CAM cell 105 does not match the compare bit on the corresponding bitline pair 115 for the CAM cell then the corresponding NFET 120 is turned on and the matchline is discharged to ground thereby causing matchline 125 to go low. A high on matchline 125 indicates a match; a low indicates not a match.

FIG. 2 is a circuit diagram of the related art CAM device of FIG. 1. In FIG. 2, CAM cells 105 are SRAM cells. Each bitline pair 115 is comprised of a bitline 135A and a bitline not 135B. Each CAM cell 105 comprises NFETs 140A, 140B, 150A and 150B. Each CAM cell 105 further comprises inverters 145A and 145B. The gate s of NFETs 140A and 140B are coupled to wordline 110. The source of NFET 140A is coupled to bitline 135A The drain of the NFET 140A is coupled to the input of inverter 145A, the output of inverter 145B and the gate of NFET 120B. The source of NFET 140B is coupled to bitline not 135B. The drain of NFET 140B is coupled to the input of inverter 145B, the output of inverter 145A and the gate of NFET 150A. The source of NFET 150A is coupled to bitline 135A. The source of NFET 150B is coupled to bitline not 135B. The drains of NFETs 150A and 150B are tied together and to the gate of NFET 120. The drain of NFET 120 is coupled to matchline 125 and the source of NFET 120 is coupled to ground. The source of PFET 130 is tied to $V_{DD}$ and the drain of PFET 130 is coupled to matchline 125. The gate of PFET 130 is coupled to SE. NFETs 140A, 140B, and inverters 145A and 145B comprise memory cell 152, which, in this example, is a SRAM cell. NFETs 150A and 150B comprise a compare cell 154, that outputs a low on a match.

In a search operation, wordline 110 is held low and matchline 125 is pre-charged high. If bitline 135A is high (bitline not 135B is low) and the output of inverter 145A is low (the output of inverter 145B is high) then NFET 150A is off, NFET 150B is on, NFET 120 is off and matchline 125 stays high indicating a match. If bitline 135A is high (bitline not 135B is low) and the output of inverter 145A is high (the output of inverter 145B is low) then NFET 150A is on, NFET 150B is off, NFET 120 is on and matchline 125 goes low indicating not a match. If bitline 135A is low (bitline not 135B is high) and the output of inverter 145A is high (the output of inverter 145B is low) then NFET 150A is on, NFET 150B is off, NFET 120 is off and matchline 125 stays high indicating a match. If bitline 135A is low (bitline not 135B is high) and the output of inverter 145A is low (inverter 145B is high) then NFET 150A is off, NFET 150B is on, NFET 120 is on and matchline 125 goes low indicating not a match.

Since there is a 50% probability of a discharge due to a mismatch on any single bit, the probability of discharging matchline 125, and then having to pre-charge again exceeds 99% when the word-length is eight or greater. This leads to high power consumption, a significant problem in devices designed for low power use. A second problem, is even with advanced CMOS technology, with very long word-lengths it is difficult to distinguish between a single NFET 120 turning on and the leakage of all NFETs 120 together in CAM device 100 leading to false compares.

SUMMARY OF THE INVENTION

A first aspect of the present invention is a content addressable memory device comprising: a NAND-NOR chain comprised an alternating sequence of NAND and NOR stages; the NAND stages, each including a first CAM cell comprising a first memory cell that stores a first data bit and a first compare cell that compares the first data bit with a first compare bit and generates a first compare signal indicating whether the first data bit matches the first compare bit and a logical NAND gate that combines the first compare signals of other first CAM cells in the NAND stage; the NOR stages, each including a second CAM cell comprising a second memory cell that stores a second data bit and a second compare cell that compares the second data bit with a second compare bit and generates a second compare signal indicating whether the second data bit matches the second compare bit and a logical NOR gate that combines the second compare signals of other second CAM cells in the NOR stage; and the NAND-NOR chain generating a match signal indicating a match of all the compare bits to all the data bits in the content addressable memory device.

A second aspect of the present invention is a content addressable memory device, comprising: a NAND-NOR chain comprising an alternating sequence of NAND and NOR stages; the NAND stages, each including a first CAM cell comprising a first memory cell that stores a first data bit and a first compare cell that compares the first data bit with a first compare bit and generates a first compare signal indicating whether the first data bit matches the first compare bit and a logical NAND gate that combines the first compare signals of other first CAM cells in the NAND stage, the output of the NAND gate going low in response to all data bits matching all compare bits in the NAND stage; the NOR stages, each including a second CAM cell comprising a second memory cell that stores a second data bit and a second compare cell that compares the second data bit with a second compare bit and generates a second compare signal indicating whether the second data bit matches the second compare bit and a logical NOR gate that combines the second compare signals of other second CAM cells in the NOR stage, the output of the NOR gate going high in response to all data bits matching all compare bits in the NOR stage; and the NAND-NOR chain generating a match signal, the match signal being high in response to a match of all the compare bits to all the data bits in the content addressable memory device.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 3:
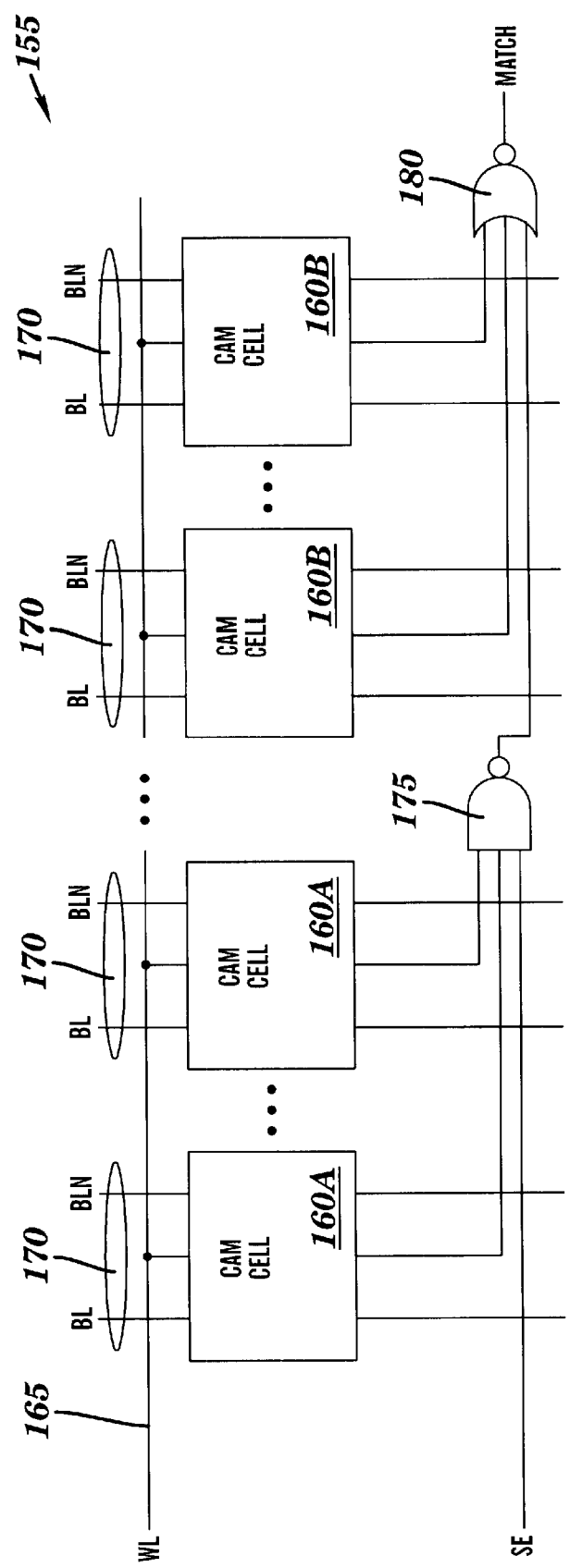
FIG. 3 is a block diagram of a CAM device according to the present invention.

FIG. 3 is a block diagram of a CAM device according to the present invention. CAM device 155 comprises a plurality of first CAM cells 160A and second CAM cells 160B, each coupled to a wordline 165. An input of each of first CAM cells 160A and second CAM cells 160B are also coupled to a pair of bitlines 170. A compare output of each first CAM cell 160A is coupled to a NAND 175 and a compare output of each second CAM cell 160B is coupled to a NOR 180. The output of NAND 175 is also coupled to an input of NOR 180. Data is written to and read out of first and second CAM cells 160A and 160B through bitline pairs 170. A wordline signal applied to wordline 165 controls to which of first and second CAM cells 160A and 160B bits are written to or read from when a plurality of CAM devices 155 are combined in an array.

When CAM device 155 is idle, search enable is low and the output NAND 175 is high and the output of NOR 180 is low. In a search operation, search enable is brought high. A match of corresponding data bits in a first CAM cell 160A to the compare bits on the corresponding bitline pair 170 results in a high on the corresponding input of NAND 175. A match of corresponding data bits in a second CAM cell 160B to the compare bits on the corresponding bitline pair 170 results in a low on the corresponding input of NOR 180. If all the data bits in first CAM cells 160A match all the corresponding compare bits on all bitline pairs 170 coupled to the first CAM cells, then the output of NAND 175 switches from high to low. If all the data bits in second CAM cells 160B match all the corresponding compare bits on all bitline pairs 170 coupled to the second CAM cell then the output of NOR 180 switches from low to high. In this manner, if all the compare bits on all of the bitlines 170 match corresponding data bits in first and second CAM cells 160A and 160B, a high will appear on the output of NOR 180 indicating a match. If any compare bit on any of the bitlines 170 do not match corresponding data bits in first and second CAM cells 160A and 160B, a low will appear on the output of NOR 180 indicating not a match.

Figure 4:
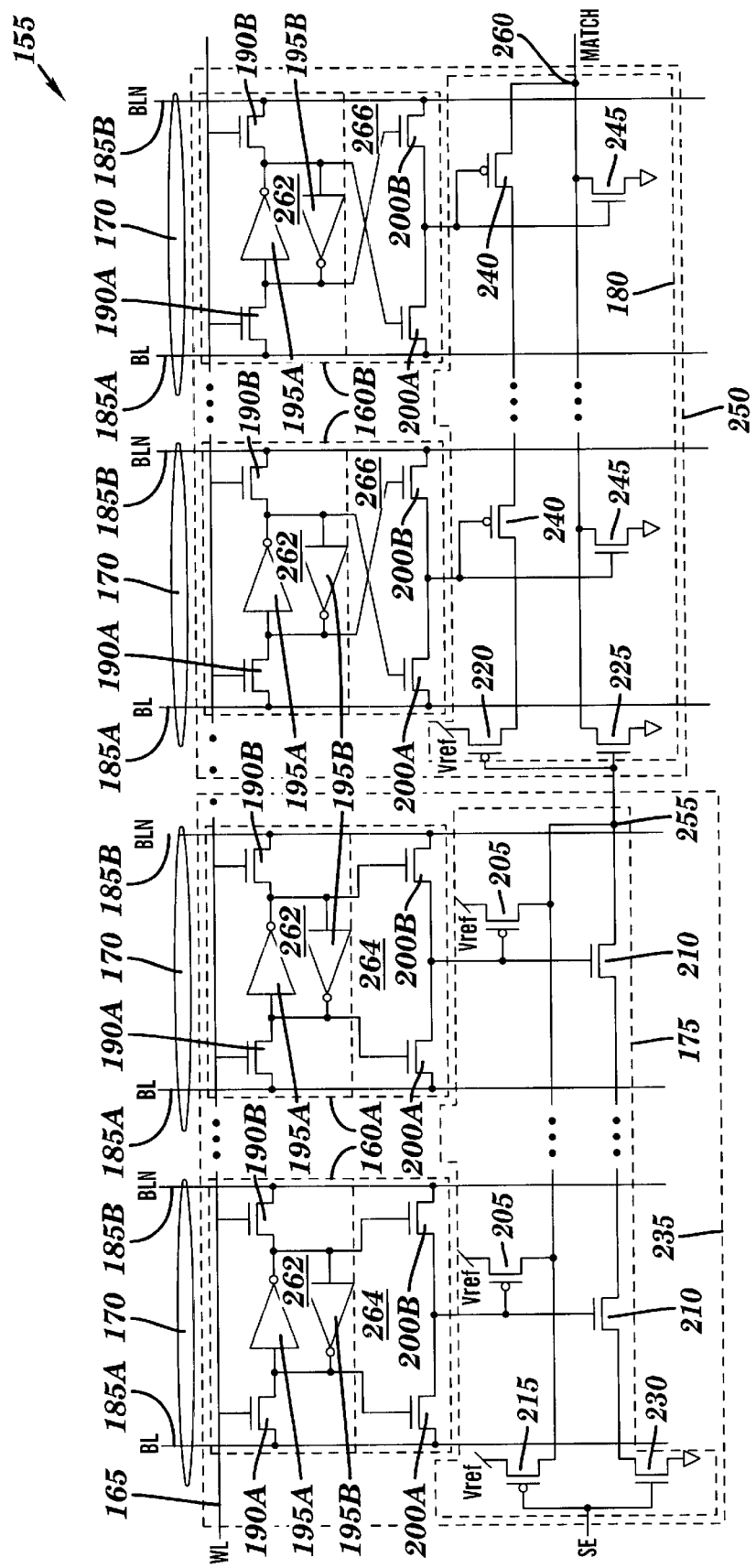
FIG. 4 is a circuit diagram of the CAM device of FIG. 3 according to the present invention.

FIG. 4 is a circuit diagram of the CAM device of FIG. 3 according to the present invention. In FIG. 4, first and second CAM cells 160A and 160B are SRAM cells. Each bitline pair 170 is comprised of a bitline 185A and a bitline not 185B. Each first and second CAM cell 160A and 160B comprises NFETs 190A, 190B, 200A and 200B. Each first and second CAM cell 160A and 160B further comprises inverters 195A and 195B. The gates of NFETs 190A and 190B are coupled to wordline 165. The sources of NFETs 190A and 200A are coupled to bitline 185A. The drain of NFET 190A is coupled to the input of inverter 195A, the output of inverter 195B and the gate of NFET 200A. The sources of NFETs 190B and 200B are coupled to bitline not 185B. The drain of NFET 190B is coupled to the input of inverter 195B, the output of inverter 195A and the gate of NFET 200B.

In first CAM cell 160A, the drains of NFETs 200A and 200B are tied together and to the gates of PFET 205 and NFET 210. The source of PFET 205 is coupled to $V_{REF}$ where $V_{REF}=V_{DD}-V_{TH}$. ($V_{TH}$ is the threshold voltage of the PFET.) The drain of PFET 205 is coupled to the drain of PFET 215 and node 255, which in turn is coupled to the gates of PFET 220 and NFET 225. The sources of PFETs 215 and 220 are tied to $V_{REF}$. The source of NFET 210 is tied to the drain of NFET 230. The source of NFET 230 is tied to ground. The gates of PFET 215 and NFET 230 are tied together and to SE. In the case of a single first CAM device 155, the drain of NFET 210 is coupled to the gates of PFET 220 and NFET 225. In the case of multiple first CAM cells 160A, as illustrated in FIG. 4, the drain of NFET 210 in an immediately prior first CAM cell is coupled to the source of NFET 210 in an immediately subsequent first CAM cell. Also, the drains of all PFETs 205 are tied together as well as to node 255.

In second CAM cell 160B, the drains of NFETs 200A and 200B are tied together and to the gates of PFET 240 and NFET 245. The source of PFET 240 is coupled to the drain of PFET 220. The drains of all NFETs 245 are coupled to the drain of NFET 225 and the sources of NFETs 225 and 245 are coupled to ground. In the case of a single second CAM device 160, the drain of PFET 240 and the drain of NFET 245 are tied to together and coupled to node 260 (MATCH). In the case of multiple second CAM devices 160, as illustrated in FIG. 4, the drain of PFET 240 in an immediately prior second CAM cell is coupled to the source of PFET 240 in an immediately subsequent second CAM cell. Also, the drains of all NFETs 245 are tied together and coupled to node 260 (MATCH).

NFETs 190A, 190B, and inverters 195A and 195B comprise a memory cell 262, which, in this example, is a SRAM cell. In CAM cell 160A, NFETs 200A and 200B comprise a compare cell 264 that produces a high on a match. In CAM cell 160B, NFETs 200A and 200B comprise a compare cell 266 that produces a low on a match. The combination of NFETs 210 and 230 and PFETs 205 and 215 comprise NAND 175. Together first CAM cell(s) 160A and NAND 175 comprise a static NAND stage 235. The combination of NFETs 225 and 245 and PFETs 220 and 240 comprise NOR 180. Together second CAM cell(s) 160B and NOR 180 comprise a static NOR stage 250.

In a search operation, wordline 165 is held low and SE is held high so PFET 215 is off and NFET 230 is on. For NAND stage 235, if bitline 185A is high (bitline not 185B is low) and the output of inverter 195A is high (the output of inverter 195B is low) then NFET 200A is off, NFET 200B is on, PFET 205 is on, NFET 210 is off and node 255 is high. If bitline 185A is high (bitline not 185B is low) and the output of inverter 195A is low (the output of inverter 195B is high) then NFET 200A is on, NFET 200B is off, PFET 205 is off, NFET 210 is on and node 255 is low.

For NOR stage 250, if node 255 is low then PFET 220 is on and NFET 225 is off. If bitline 185A is high (bitline not 185B is low) and the output of inverter 195A is high (the output of inverter 195B is low) then NFET 200A is on, NFET 200B is off and PFET 240 is off, NFET 245 is on and node 260 is low indicating not a match. If bitline 185A is high (bitline not 185B is low) and output of inverter 195A is low (the output of inverter 195B is high) then NFET 200A is off, NFET 200B is on and PFET 240 is on, NFET 245 is off and node 260 is high indicating a match. If node 255 is high, then PFET 220 is off and NFET 225 is on then node 260 will be low regardless of the compare results in CAM cell(s) 160 indicating not a match.

For NAND stage 235, if bitline 185A is low (bitline not 185B is high) and the output of inverter 195A is low (the output of inverter 195B is high) then NFET 200A is on, NFET 200B is off, PFET 205 is on, NFET 210 is off and node 255 is high. If bitline 185A is low (bitline not 185B is high) and the output of inverter 195A is high (the output of inverter 195B is low) then NFET 200A is off, NFET 200B is on, PFET 205 is off, NFET 210 is on and node 255 is low.

For NOR stage 250, if node 255 is high then PFET 220 is off and NFET 225 is on If bitline 185A is low (bitline not 185B is high) and the output of inverter 195A is low (the output of inverter 195B is high) then NFET 200A is off, NFET 200B is on and PFET 240 is off, NFET 245 is on and node 260 is low indicating a not a match. If bitline 185A is low (bitline not 185B is high) and output of inverter 195A is high (the output of inverter 195B is low) then NFET 200A is on, NFET 200B is off and PFET 240 is on, NFET 245 is off and node 260 is high indicating a match. If node 255 is low, then PFET 220 is on and NFET 225 is off then node 260 will be high regardless of the compare results in CAM cell(s) 160 indicating a match.

Figure 5A:
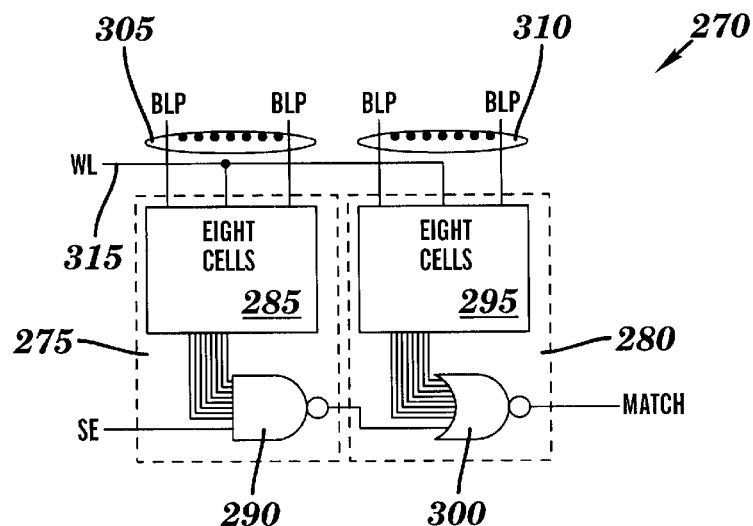
FIGS. 5A through 5C are block diagrams illustrating alternative arrangements of a sixteen cell CAM device according to the present invention.
Figure 5B:
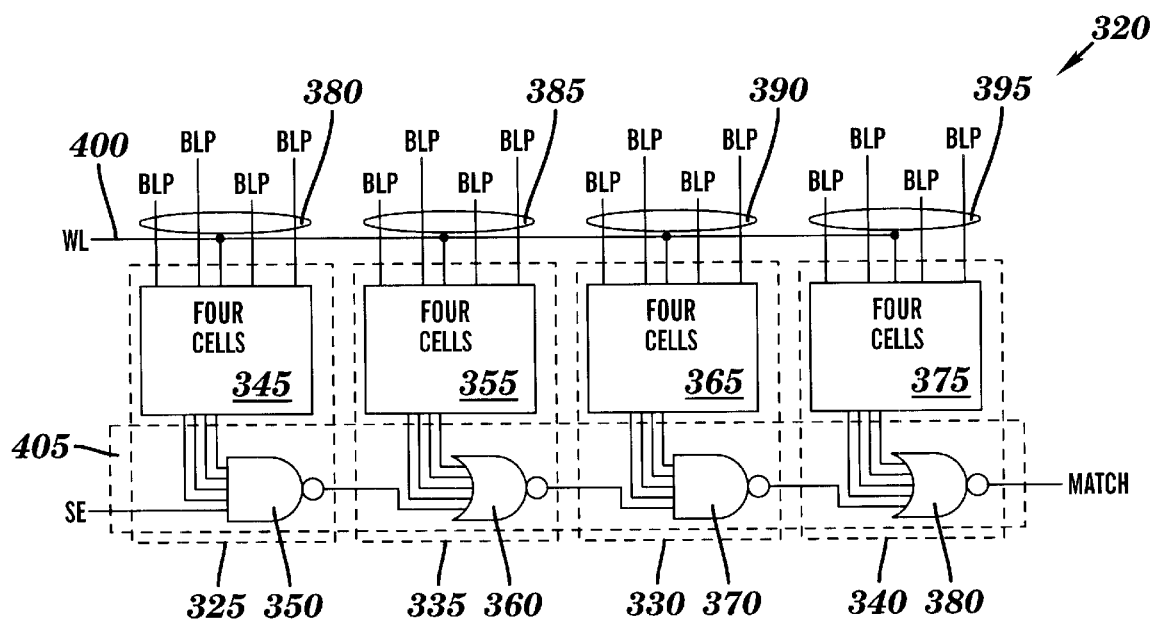
Figure 5C:
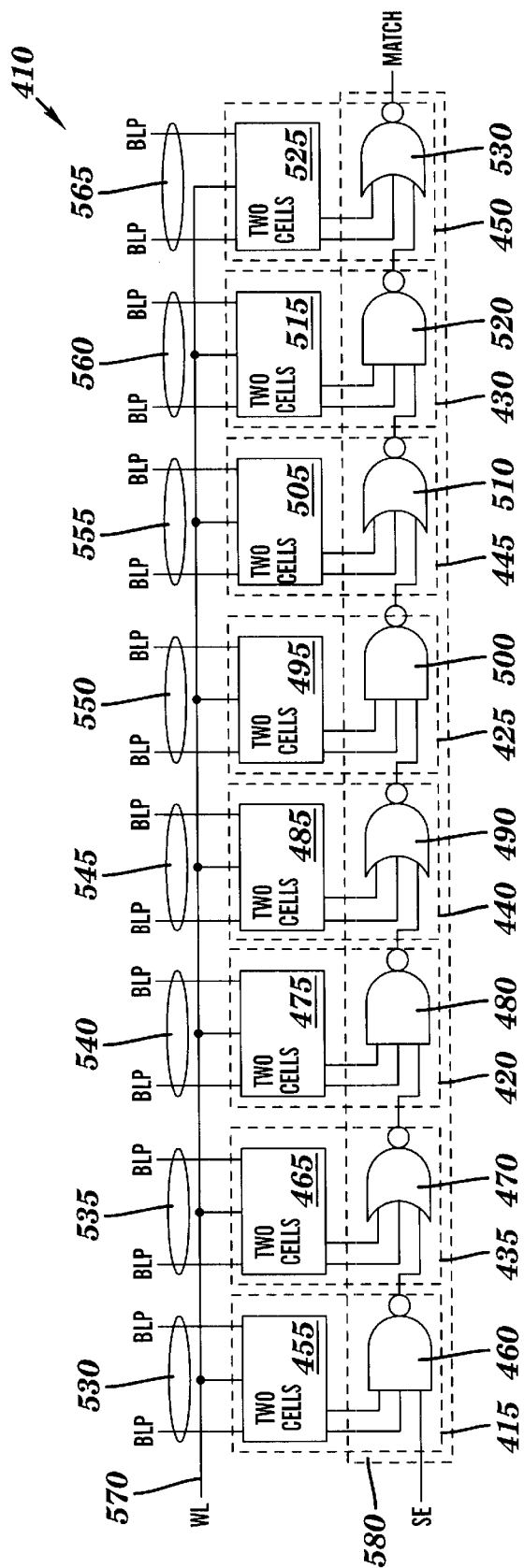

FIGS. 5A through 5C are block diagrams illustrating alternative arrangements of a sixteen cell CAM device according to the present invention. In FIG. 5A, CAM device 270 comprises a NAND stage 275 and a NOR stage 280. NAND stage 275 includes a first set of eight cells 285, each cell of the first set of cells coupled to one of the first eight inputs of a nine way NAND gate 290. NOR stage 280 includes a second set of eight cells 295, each cell of the second set of cells coupled to one of the first eight inputs of a nine way NOR gate 300. Each cell in first set of cells 285 is identical to CAM cell 160A illustrated in FIG. 4 and described above. Each cell in second set of cells 295 is identical to CAM cell 160B illustrated in FIG. 4 and described above. CAM device 270 further includes a first set of eight bitline pairs (BLP) 305, a pair of the first set of bitline pairs coupled to each cell in first set of cells 285 and a second set of eight bitline pairs 310, a pair of the second set of bitline pairs coupled to each cell in second set of cells 295. A wordline 315 is coupled to each cell in first and second sets of cells 285 and 295. SE is coupled to the ninth input of NAND gate 290. The output of NAND gate 290 is coupled to the ninth input of NOR gate 300. The output of NOR gate 300 is coupled to MATCH.

In FIG. 5B, CAM device 320 comprises first and second NAND stages 325 and 330 and first and second NOR stages 335 and 340. First NAND stage 325 includes a first set of four cells 345, each cell of the first set of cells coupled to one of the first four inputs of a first five way NAND gate 370. First NOR stage 335 includes a second set of four cells 355, each cell of the second set of cells coupled to one of the first four inputs of a first five way NOR gate 360. Second NAND stage 330 includes a third set of four cells 365, each cell of the third set of cells coupled to one of the first four inputs of a second five way NAND gate 350. Second NOR stage 340 includes a fourth set of four cells 375, each cell the fourth set of cells coupled to one of the first four inputs of a second five way NOR gate 380. Each cell in first and third set of cells 345 and 365 is identical to CAM cell 160A illustrated in FIG. 4 and described above. Each cell in second and fourth set of cells 355 and 375 is identical to CAM cell 160B illustrated in FIG. 4 and described above.

CAM device 320 further includes a first set of four bitline pairs 380, a pair of the first set of bitline pairs coupled to each cell in first set of cells 345, a second set of four bitline pairs 385, a pair of the second set of bitline pairs coupled to each cell in second set of cells 355, a third set of four bitline pairs 390, a pair of the third set of bitline pairs coupled to each cell in third set of cells 365 and a fourth set of four bitline pairs 395, a pair of the fourth set of bitline pairs coupled to each cell in fourth set of cells 375. A wordline 400 is coupled to each cell in first, second, third and fourth sets of cells 345, 355, 365 and 375.

SE is coupled to the fifth input of first NAND gate 350. The output of first NAND gate 350 is coupled to the fifth input of first NOR gate 360, the output of the first NOR gate is coupled to the fifth input of second NAND gate 370, the output of the second NAND gate is coupled to the fifth input of second NOR gate 380 and the output of the second NOR gate is coupled to MATCH. First and second NAND gates 350 and 370, alternating with first and second NOR gates 360 and 380 form a NAND-NOR chain 405.

In FIG. 5C, CAM device 410 comprises first, second, third and fourth NAND stages 415, 420, 425 and 430 and first, second, third and fourth NOR stages 435, 440, 445 and 450. First NAND stage 415 includes a first set of two cells 455, each cell of the first set of cells coupled to one of the first two inputs of a first three way NAND gate 460. First NOR stage 435 includes a second set of two cells 465, each cell of the second set of cells coupled to one of the first two inputs of a first three way NOR gate 470. Second NAND stage 420 includes a third set of two cells 475, each cell of the third set of cells coupled to one of the first two inputs of a second three way NAND gate 480. Second NOR stage 440 includes a fourth set of two cells 485, each cell of the fourth set of cells coupled to one of the first two inputs of a second three way NOR gate 490. Third NAND stage 425 includes a fifth set of two cells 495, each cell of the fifth set of cells coupled to one of the first two inputs of a third three way NAND gate 500. Third NOR stage 445 includes a sixth set of two cells 505, each cell the sixth set of cells coupled to one of the first two inputs of a third three way NOR gate 510. Fourth NAND stage 430 includes a seventh set of two cells 515, each cell of the seventh set of cells coupled to one of the first two inputs of a fourth three way NAND gate 520.

Fourth NOR stage 450 includes an eighth set of two cells 525, each cell the eighth set of cells coupled to one of the first two inputs of a fourth three way NOR gate 530.

Each cell in first, third, fifth and seventh set of cells 455, 475, 495 and 515 is identical to CAM cell 160A described above and illustrated in FIG. 4. Each cell in second, fourth, sixth and eighth set of cells 465, 485, 505 and 525 is identical to CAM cell 160B described above and illustrated in FIG. 4. CAM device 410 further includes a first set of two bitline pairs 530, a pair of the first set of bitline pairs coupled to each cell in first set of cells 455, a second set of two bitline pairs 535, a pair of the second set of bitline pairs coupled to each cell in second set of cells 465, a third set of two bitline pairs 540, a pair of the third set of bitline pairs coupled to each cell in third set of cells 475, a fourth set of two bitline pairs 545, a pair of the fourth set of bitline pairs coupled to each cell in fourth set of cells 485, a fifth set of two bitline pairs 550, a pair of the first set of bitline pairs coupled to each cell in fifth set of cells 495, a sixth set of two bitline pairs 555, a pair of the sixth set of bitline pairs coupled to each cell in sixth set of cells 505, a seventh set of two bitline pairs 560, a pair of the seventh set of bitline pairs coupled to each cell in seventh set of cells 515, an eighth set of two bitline pairs 565, a pair of the eighth set of bitline pairs coupled to each cell in eighth set of cells 525. A wordline 570, is coupled to each cell in first, second, third and fourth, fifth, sixth, seventh and eighth sets of cells 455, 465, 475 and 485, 495, 505, 515 and 525.

SE is coupled to the third input of first NAND gate 460. The output of first NAND gate 460 is coupled to the third input of first NOR gate 470, the output of the first NOR gate is coupled to the third input of second NAND gate 480, the output of the second NAND gate is coupled to the third input of second NOR gate 490, the output of the second NOR gate is coupled to the third input of third NAND gate 500, the output of the third NAND gate is coupled to the third input of third NOR gate 510, the output of the third NOR gate is coupled to the third input of fourth NAND gate 520, the output of the fourth NAND gate 520 is coupled to the third input of the fourth NOR gate 530, and the output of the fourth NOR gate is coupled to MATCH. First, second, third and fourth NAND gates 460, 480, 500 and 520, alternating with first, second, third and fourth NOR gates 470, 490, 510 and 530 form a NAND-NOR chain 580.

In each of the examples illustrated in FIGS. 5A through 5C, the NAND-NOR chain always starts with a NAND gate and ends with a NOR gate. There are always equal and even numbers of NAND and NOR gates. CAM device 270 consumes the most power. CAM device 410 consumes the least power. CAM device 320 is intermediate in power consumption between CAM devices 320 and 410.

In each of FIGS. 5A, 5B and 5C, each NAND gate has had the same number of input CAM cells and each NOR gate has had the same number of input CAM cells. This number has been the same for both NAND and NOR gates. However, each NAND gate may have a different number of input CAM cells and each NOR gate may have a different number input CAM cells, and the number of input CAM cells for NAND gates need not be equal to the number of input CAM cells for NOR gates. That is, any gate (NAND or NOR) may have any number of input CAM cells.

Turning to the relative power consumption of CAM device 100 and CAM device 155 (the present invention), the average power dissipated by a complimentary-metal-oxide-silicon (CMOS) circuit toggling its output from high to low (or low to high) is given by:

$$p = Cv^2 f \qquad (1)$$

wherein:

C=average total capacitance switched by the circuit;

v=difference in the voltage between high and low states; and f=frequency at which the switching event occurs.

Figure 2:
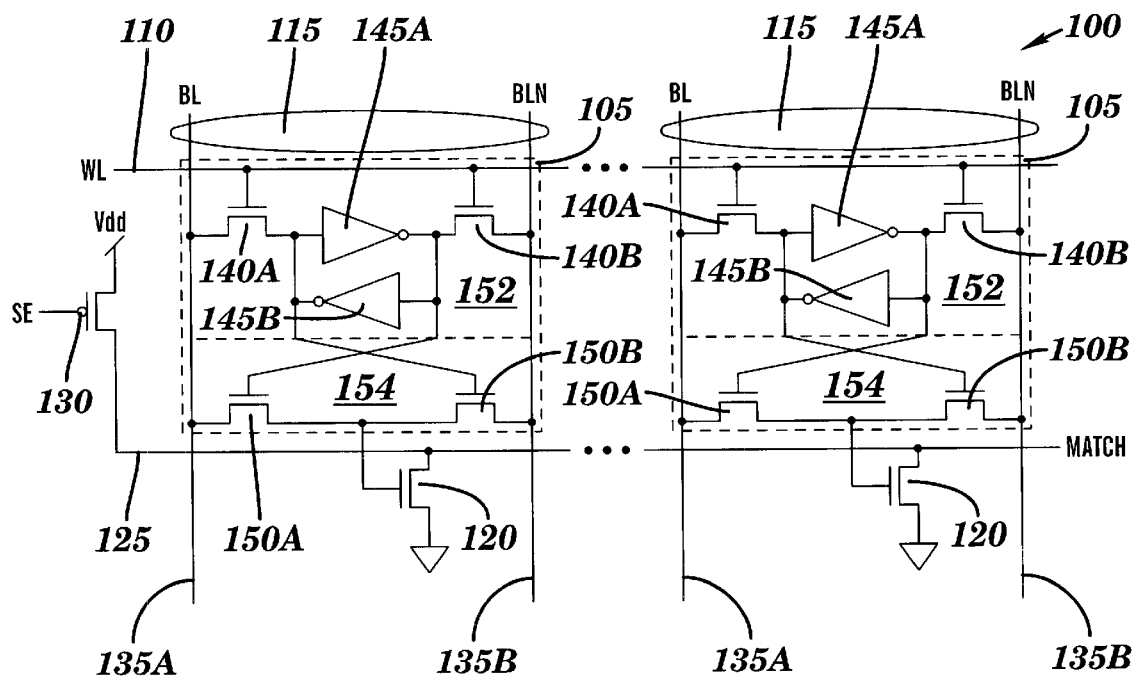
FIG. 2 is a circuit diagram of the related art CAM device of FIG. 1.

For CAM device 100 illustrated in FIG. 2 and described above and for CAM device 155 (the present invention), illustrated in FIG. 4 and described above, the total capacitance is given by:

$$C_{TOTAL} = C_{BITLINE} + C_{MATCHLINE} \qquad (2)$$

wherein:

$C_{TOTAL}$=the total capacitance of the CAM device;

$C_{BITLINE}$=the capacitance of the CAM device attributable to bitline loading; and $C_{MATCHLINE}$=the capacitance of the CAM device attributable to matchline loading. The first component, $C_{BITLINE}$, is approximately equal in both CAM devices 100 and 155. The second component, $C_{MATCHLINE}$, is less in CAM device 155 than in CAM device 100.

For CAM device 100, the average matchline capacitance switched during a search operation is computed by assuming n its in each word, each bit having a 0.5 probability of matching the search argument and contributing a capacitance of $C_1$. The matchline capacitance is therefore given by:

$$C_{MATCHLINE} = (1-(0.5)^n)(nC_1) \qquad (3)$$

For sufficiently large values of n, the value of $(1-(0.5)^n)$ approaches 1. Therefore equation (3) becomes:

$$C_{MATCHLINE} \approx nC_1 \qquad (4)$$

For CAM device 155, the average matchline capacitance switched during a search operation is computed by assuming n bits in each word, each bit having a 0.5 probability of matching the search argument and contributing a capacitance of $C_2$ to the matchline segment and driving a load of $C_3$; and the number of bits in each matchline segment is m (which means n/m segments). The total matchline capacitance is therefore given by:

$$C'_{MATCHLINE} = [(0.5)^m + (0.5)^{2m} + \ldots (0.5)^{(n/m)\,m}]C_2 + C_3) \qquad (5)$$

In this expression, the series sum is bounded by the value 1 (in other words $[(0.5)^m + (0.5)^{2m} + \ldots (0.5)^{(n/m)m}] < 1$). This leads to the simplified, upper-bounded expression:

$$C'_{MATCHLINE} < mC_2 + C_3 \qquad (6)$$

Figure 1:
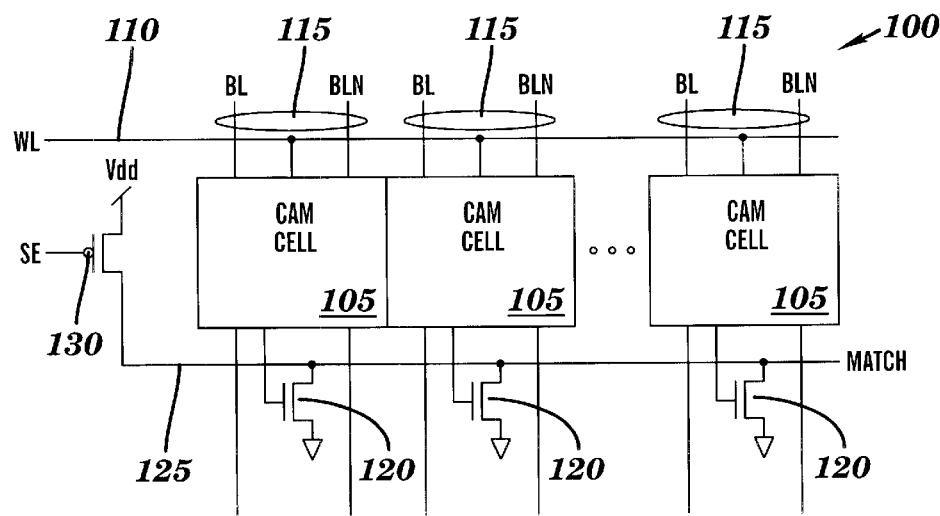
FIG. 1 is a block diagram of a related art CAM device.

Thus, CAM device 155, uses less power than CAM device 100 whenever $C'_{MATCHLINE} < C_{MATCHLINE}$ or $mC_2 + C_3 < nC_1$. This is generally easy to accomplish whenever m+1<n and $C_1 \approx C_2 \approx C_3$. For example, for CAM device 100 of FIG. 1 n=16 and if the capacitance of the CAM device is C=1, then from equation (4) $C_{MATCHLINE}=16$. For CAM device 155 of FIG. 3, m=4 and if both $C_2$ and $C_3=2$, then $C'_{MATCHLINE}=10$ which is less than 16.

Figure 6B:
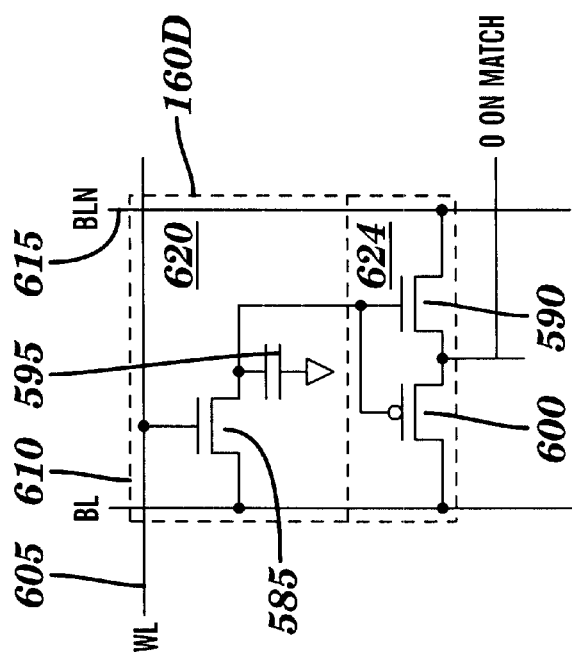
FIGS. 6A and 6B are circuit diagrams of DRAM useable in the present invention.
Figure 6A:
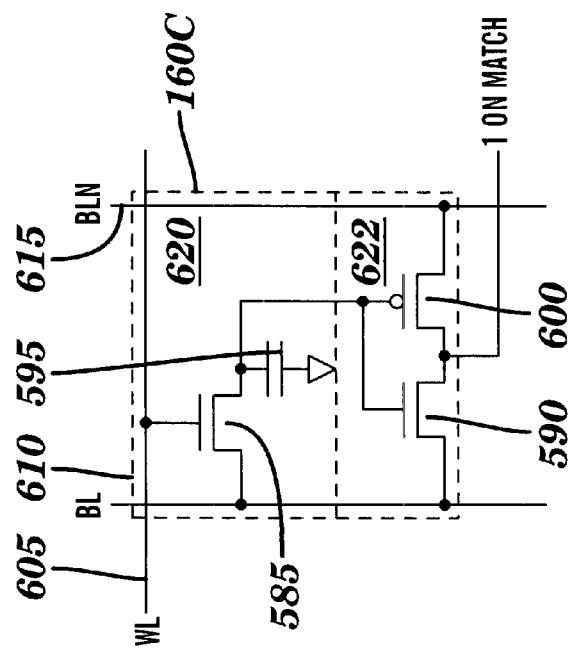

FIGS. 6A and 6B are circuit diagrams of DRAM useable in the present invention. CAM device 155 has been presented using SRAM technology in first CAM cell 160A and second CAM cell 160B. As will be remembered, CAM cell 160A produces a high on a match and CAM cell 160B produces a low on a match. CAM cells 160A and 160B can use DRAM technology as well.

In FIG. 6A, CAM cell 160C comprises NFETs 585 and 590, capacitor 595, and PFET 600. The gate of NFET 585 is coupled to a wordline 605. The drain of NFET 585 is coupled to one plate of capacitor 595 and the gates of NFET 590 and PFET 600. The second plate of capacitor 595 is tied to ground. The sources of NFETs 585 and 590 are coupled to a bitline 610 and the source of PFET 600 is coupled to a bitline-not 615. The drain of NFET 590 and the drain of PFET 600 are coupled and form the compare output of CAM cell 160C. NFET 585 and capacitor 595 comprise a memory cell 620. NFET 590 and PFET 600 comprise a compare cell 622.

In FIG. 6B, CAM cell 160D comprises NFETs 585 and 590, capacitor 595, and PFET 600. The gate of NFET 585 is coupled to a wordline 605. The drain of NFET 585 is coupled to one plate of capacitor 595 and the gates of NFET 590 and PFET 600. The second plate of capacitor 595 is tied to ground. The source of NFET 585 and the source of PFET 600 are coupled to a bitline 610 and the source of NFET 590 is coupled to a bitline-not 615. The drain of NFET 590 and the drain of PFET 600 are coupled and form the compare output of CAM cell 160D. NFET 585 and capacitor 595 comprise memory cell 620. NFET 590 and PFET 600 comprise a compare cell 624.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A content addressable memory device, comprising:
   a NAND-NOR chain comprised an alternating sequence of NAND and NOR stages;
   said NAND stages, each including a first CAM cell comprising a first memory cell that stores a first data bit and a first compare cell that compares the first data bit with a first compare bit and generates a first compare signal indicating whether the first data bit matches the first compare bit and a logical NAND gate that combines the first compare signals of other first CAM cells in said NAND stage;
   said NOR stages, each including a second CAM cell comprising a second memory cell that stores a second data bit and a second compare cell that compares the second data bit with a second compare bit and generates a second compare signal indicating whether the second data bit matches the second compare bit and a logical NOR gate that combines the second compare signals of other second CAM cells in said NOR stage; and
   said NAND-NOR chain generating a match signal indicating a match of all the compare bits to all the data bits in said content addressable memory device.

2. The content addressable memory device of claim 1, wherein the output of a preceding NAND gate is coupled to one of the inputs of a following NOR gate and the output of a preceding NOR gate is coupled to one of the inputs of a following NAND gate in said NAND-NOR chain.

3. The content addressable memory of claim 1, wherein said first compare signal is a high upon a match of the first data bit to the first compare bit and said second compare signal is a low upon a match of the second data bit to the second compare bit.

4. The content addressable memory device of claim 1, wherein said first and second compare cells each comprises a pair of transistors.

5. The content addressable memory device of claim 1, wherein said first and second memory cells are SRAM cells.

6. The content addressable memory device of claim 1, wherein said first and second memory cells are DRAM cells.

7. The content addressable memory device of claim 5, wherein said first and second compare cells each comprises a pair of NFETs.

8. The content addressable memory device of claim 6, wherein said first and second compare cells each comprises an NFET and a PFET.

9. The content addressable memory device of claim 1, wherein the number of said NAND stages is equal to the number of said NOR stages.

10. The content addressable memory device of claim 1, wherein the number of said first CAM cells in each said NAND stage is equal to the number of said second CAM cells in each said NOR stage.

11. The content addressable memory device of claim 1, wherein the number of said first CAM cells in each said NAND stage is not equal to the number of said second CAM cells in each said NOR stage.

12. A content addressable memory device, comprising:
    a NAND-NOR chain comprising an alternating sequence of NAND and NOR stages;
    said NAND stages, each including a first CAM cell comprising a first memory cell that stores a first data bit and a first compare cell that compares the first data bit with a first compare bit and generates a first compare signal indicating whether the first data bit matches the first compare bit and a logical NAND gate that combines the first compare signals of other first CAM cells in said NAND stage, the output of said NAND gate going low in response to all data bits matching all compare bits in said NAND stage;
    said NOR stages, each including a second CAM cell comprising a second memory cell that stores a second data bit and a second compare cell that compares the second data bit with a second compare bit and generates a second compare signal indicating whether the second data bit matches the second compare bit and a logical NOR gate that combines the second compare signals of other second CAM cells in said NOR stage, the output of said NOR gate going high in response to all data bits matching all compare bits in said NOR stage; and
    said NAND-NOR chain generating a match signal, said match signal being a high in response to a match of all the compare bits to all the data bits in said content addressable memory device.

13. The content addressable memory device of claim 12, wherein the output a preceding NAND gate is coupled to one of the inputs of a following NOR gate and the output of a preceding NOR gate is coupled to one of the inputs of a following NAND gate in said NAND-NOR chain.

14. The content addressable memory of claim 12, wherein said first compare cell produces a high upon a match of the first data bit to the first compare bit and said second compare cell produces a low upon a match of the second data bit to the second compare bit.

15. The content addressable memory device of claim 12, wherein said first and second compare cells each comprises a pair of transistors.

16. The content addressable memory device of claim 12, wherein said first and second memory cells are SRAM cells.

17. The content addressable memory device of claim 12, wherein said first and second memory cells are DRAM cells.

18. The content addressable memory device of claim 16, wherein said first and second compare cells each comprises a pair of NFETs.

19. The content addressable memory device of claim 17, wherein said first and second compare cells each comprises an NFET and a PFET.

20. The content addressable memory device of claim 12, wherein the number of said NAND stages is equal to the number of said NOR stages.

21. The content addressable memory device of claim 12, wherein the number of said first CAM cells in each said NAND stage is not equal to the number of said second CAM cells in each said NOR stage.

22. The content addressable memory device of claim 12, wherein the number of said first CAM cells in each said NAND stage is equal to the number of said second CAM cells in each said NOR stage.

* * * * *